United States Patent
Zolfaghari

(10) Patent No.: US 7,268,598 B2
(45) Date of Patent: Sep. 11, 2007

(54) METHOD AND SYSTEM FOR PROVIDING A POWER-ON RESET PULSE

(75) Inventor: Alireza Zolfaghari, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 8 days.

(21) Appl. No.: 10/975,103

(22) Filed: Oct. 28, 2004

(65) Prior Publication Data

US 2006/0066367 A1   Mar. 30, 2006

Related U.S. Application Data

(60) Provisional application No. 60/614,416, filed on Sep. 30, 2004.

(51) Int. Cl.
*H03K 3/02* (2006.01)

(52) U.S. Cl. ........................ 327/143; 327/198

(58) Field of Classification Search ............... 327/142, 327/143, 198
See application file for complete search history.

(56) References Cited

U.S. PATENT DOCUMENTS

| | | | |
|---|---|---|---|
| 4,245,150 A * | 1/1981 | Driscoll et al. ............... 377/32 |
| 5,376,834 A * | 12/1994 | Carobolante ................ 327/143 |
| 5,416,438 A * | 5/1995 | Shibata ....................... 327/552 |
| 5,513,358 A * | 4/1996 | Lundberg et al. ........... 713/330 |
| 6,011,445 A * | 1/2000 | Nikhade et al. ............. 331/173 |
| 6,417,704 B1 * | 7/2002 | Nakajima et al. ........... 327/143 |
| 6,661,264 B2 * | 12/2003 | Moyal et al. ................ 327/143 |
| 7,055,064 B2 * | 5/2006 | Lin .............................. 714/23 |
| 7,057,427 B2 * | 6/2006 | Wadhwa et al. ............ 327/143 |
| 7,091,758 B2 * | 8/2006 | Chun et al. ................. 327/143 |
| 2006/0012409 A1 * | 1/2006 | Wadhwa et al. ............ 327/143 |
| 2006/0044028 A1 * | 3/2006 | Bhattacharya et al. ...... 327/143 |

* cited by examiner

*Primary Examiner*—Tuan T. Lam
*Assistant Examiner*—William Hernandez
(74) *Attorney, Agent, or Firm*—Sterne, Kessler, Goldstein & Fox PLLC

(57) ABSTRACT

Provided are a method and system for providing a power-on reset pulse. The system includes a level detector configured to receive an input signal and produce, at least indirectly, a reset signal when the input signal reaches a predetermined level. The system also includes a counter having counting characteristics and configured to receive the reset signal and a clock signal. The counter produces a delayed signal in accordance with the counting characteristics, the clock signal, and the received reset signal.

11 Claims, 2 Drawing Sheets

METHOD AND SYSTEM FOR PROVIDING A POWER-ON RESET PULSE

CROSS-REFERENCE TO RELATED APPLICATIONS

This application claims the benefit of U.S. Provisional Application No. 60/614,416 filed Sep. 30, 2004, which is incorporated herein by reference.

BACKGROUND OF THE INVENTION

1. Field of the Invention

The present invention relates generally to power-on mechanisms used to provide reset pulses.

2. Background Art

Many types of circuits require use of a power-on reset circuit to provide a reset pulse. This reset pulse is used to facilitate a delayed activation of some other circuit component, such as a memory cell.

One traditional power-on reset circuit comprises a resistor-capacitor (RC) low pass filter connected to a voltage supply. In this traditional reset circuit, when the voltage supply ramps up as power is provided, the ramp up of the voltage across the capacitor is delayed. Depending on the specific RC values involved, the voltage across the capacitor can increase exponentially, which in turn provides the delay. This capacitor voltage can subsequently be applied to a comparator (or an inverter gate) to convert the exponential signal to a squared pulse for increased compatibility with other aspects of the circuit.

Thus, the traditional RC circuit might be suitable for use as a power-on circuit in many respects. However, the large values typically required of the resistor and the capacitor make most of the traditional RC circuits so physically large, that integration into integrated circuits (ICs) is impractical. Therefore, if integration of the power-on reset circuit into an IC is desired, the traditional RC power-on circuit design will be inadequate.

What is needed, therefore, is a method and system for providing a reset circuit suitable for integration onto an IC.

BRIEF SUMMARY OF THE INVENTION

Consistent with the present invention as embodied and broadly described herein, the present invention includes a level detector configured to receive an input signal and produce, at least indirectly, a reset signal when the input signal reaches a predetermined level. The system also includes a counter having counting characteristics and configured to receive the reset signal and a clock signal. The counter produces a delayed signal in accordance with the counting characteristics, the clock signal, and the received reset signal.

The present invention produces a reset pulse as an output signal that can be used to reset any circuit requiring a delayed activation signal, such as memory cells. A circuit that comprises the present invention can also be integrated onto an IC.

Further features and advantages of the present invention as well as the structure and operation of various embodiments of the present invention, are described in detail below with reference to the accompanying drawings.

BRIEF DESCRIPTION OF THE DRAWINGS

The accompanying drawings, which are incorporated in and constitute part of the specification, illustrate embodiments of the invention and, together with the general description given above and the detailed description of the embodiment given below, serve to explain the principles of the present invention. In the drawings.

DETAILED DESCRIPTION OF THE INVENTION

The following detailed description of the present invention refers to the accompanying drawings that illustrate exemplary embodiments consistent with this invention. Other embodiments are possible, and modifications may be made to the embodiments within the spirit and scope of the invention. Therefore, the following detailed description is not meant to limit the invention. Rather, the scope of the invention is defined by the appended claims.

Figure 1:
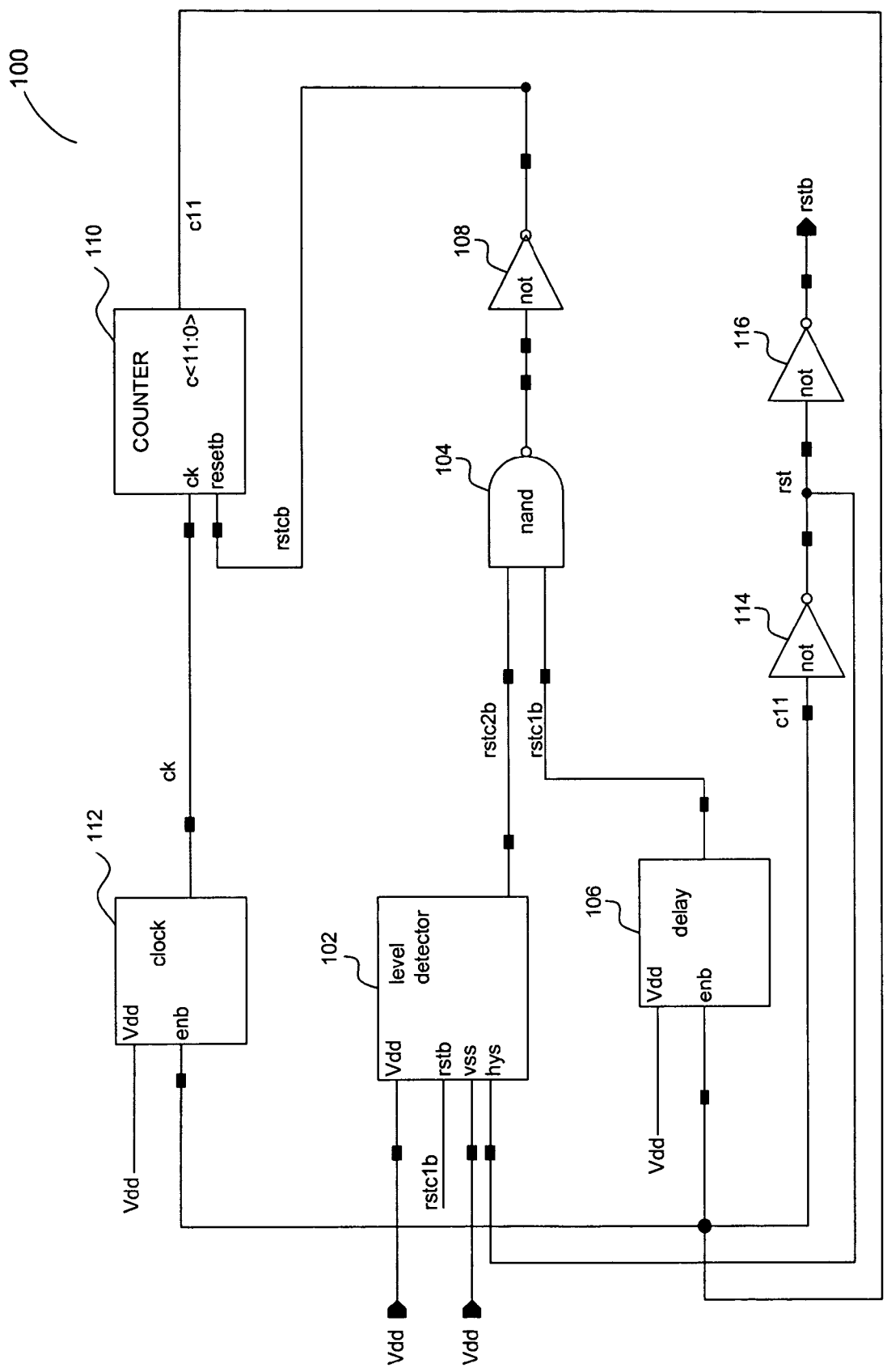
FIG. 1 is a schematic diagram of a power-on reset circuit topology arranged in accordance with an embodiment of the present invention.

FIG. 1 is a schematic diagram of a power-on reset circuit 100 constructed in accordance with an embodiment of the present invention. In FIG. 1, the reset circuit 100 is provided to receive an input signal and provide an output signal that is, for example, a delayed version of the input signal.

The circuit 100 includes a level detector 102 configured to receive a voltage signal $V_{dd}$ as an input. The level detector 102 can be implemented using approaches well known to those of skill in the art. In the level detector 102, if the input voltage signal $V_{dd}$ passes a predetermined first threshold value, an output value (rstc2b) is produced.

Prior to the signal $V_{dd}$ reaching the predetermined first threshold value, the output of the level detector 102 is low (zero). After the signal $V_{dd}$ reaches the predetermined first threshold value, the output of the level detector 102 goes high. The signal rstc2b output from the level detector 102 is provided as an input to a logic gate 104. In the exemplary embodiment of FIG. 1, the logic gate 104 is implemented as a NAND gate, although the present invention is not limited to this specific implementation.

The circuit 100 also includes a delay component 106. The delay component 106 is used primarily as a reliability feature. For example, the delay component 106 ensures that an output signal, produced by the circuit 100, includes at least a minimum amount of delay. The delay component 106 produces an output signal rstc1b, which is also provided as an input to the logic gate 104.

When both the rstc1b signal and the rstc2b signal are high, the logic gate 104 produces an output signal having a low level. The output of the logic gate 104 is provided as an input to an inverter 108. The inverter 108 converts the output of the logic gate 104 from a low level to a high level and produces an output signal rstcb.

The signal rstcb is then provided as an input reset signal to a counter 110. Prior to receiving the reset signal rstcb, the counter 110 was in reset mode (not counting). However, upon receipt of the reset signal rstcb, the counter 110 is released, since the signal rstcb resets a reset bar (resetb) within the counter 110, which was low. When the counter 110 receives the input signal rstcb, the reset bar resetb goes up and the counter 110 is configured to perform its normal operations.

The circuit 100 also includes a clock generator 112. The clock generator 112 provides an output signal CK as another input to the counter 110. In the exemplary embodiment of FIG. 1, the clock 112 included within the circuit 100. However, in an alternative embodiment, the clock 112 can be external to the circuit 100. That is, the clock signal CK can be fed or provided from an off chip location or by a central clock.

When the counter 110 receives the clock signal CK and the signal rstcb, the counter 110 begins to count. Depending on the frequency of the clock signal CK and the number of bits within the counter 110, an output reset pulse is produced by the counter 110. This output reset pulse will be released from the counter 110 after an amount of user programmable delay.

The clock signal CK can be, for example, a 2 megahertz (MHz) square wave. For instance, with a clock period of 500 nanoseconds (ns) and assuming that the counter 110 is a 12-bit counter, the reset pulse will be 500e-9*2^11=1.024 milliseconds (ms). In general, if the clock frequency is assumed to be fck and the msb of an n-bit counter is uses, then the reset pulse is 1/fck*2^(n−1).

Prior to the counter 110 beginning its count, the output rstb of the circuit 100 is low. In the example of the 2 MHz square wave above, the signal rstb will remain low, for example, for about 1 ms. After 1 ms, the output signal rstb will go high. That is, although the signal $V_{dd}$ input to the level detector 102 went high immediately, the circuit 100 produced an output signal rstb (as a reset signal) after a delay of 1 ms.

Prior to receiving the clock signal CK and the reset signal rstcb, the counter 110 is in reset mode (i.e., all of its 12 bits are set to zero). When the counter 110 receives the clock signal CK and the reset signal rstcb, the counter 110 begins to count and its bits begin to change. The counter 110 counts until the MSB (most significant bit) is set to one. For example, for a 12 bit counter, the counter 110 begins counting from 0000 0000 0000 and when it reaches 1000 0000 0000, the output goes high.

In FIG. 1 we are using the MSB. This gives us a reset pulse of 1/fck*2^(n−1). The mth bit of the counter may be used where m≧0 and m>n-1. In this case the reset pulse is 1/fck*2^m. Additionally, some or all of the outputs of the counter 110 may be combined to derive other values for the reset pulse.

The signal c11 is provided as an input to an inverter 114. The inverter 114 converts the high level signal c11 to a low signal and provides a low level signal (rst) as an output. The output signal rst is provided as an input to another inverter 116, where it is output as a high level signal (rstb). The high level output signal rstb is a delayed version of the input signal $V_{dd}$, that was provided as the original input to the level detector 102.

The signal c11 is also provided as an input to the delay component 106 and the clock generator 112. The signal c11 is used to subsequently deactivate the delay component 106 and the clock generator 112 at a predetermined time, to conserve power. Thus, the signal c11 is provided as an enabling signal to the delay component 106 and the clock generator 112. When an enable bar (enb) within the delay 106 and the clock 112 becomes high, both are deactivated.

When deactivated, the delay component 106 and the clock generator 112 no longer consume power. Also, when the delay component 106 and the clock generator 112 are deactivated, the counter 110 no longer receives an input signal, since the signal CK is not provided.

A hysteresis connection is provided between the level detector 102 and the inverters 114 and 116. The hysteresis connection guarantees the attainment of two separate output threshold levels, providing in more precise terms, when the output of the level detector 102 goes high, and when is goes low again.

For example, when the input signal $V_{dd}$ goes high (i.e., reaches its first threshold), as discussed above, the output signal rstcb2 from the level detector 102 correspondingly goes high. However, with hysteresis, when the input signal subsequently $V_{dd}$ drops below a certain predetermined value (i.e., a second threshold), the output signal rstc2b returns to a low state.

Thus, the present invention, as implemented within the exemplary circuit 100, does two things. The circuit 100 provides a reset signal rstb upon power-on, if the input signal $V_{dd}$ exceeds a first threshold. The circuit 100 continues to provide the reset signal rstb until the input signal $V_{dd}$ drops below a second predetermined (e.g., programmable) threshold level.

As noted above, the delay circuit 106 adds an additional level of reliability to the circuit 100. The delay circuit 106 provides an extra delay such that if the level detector 102 malfunctions, the output of the circuit 106 is the same as the input $V_{dd}$, but delayed by a few microseconds instead of a few milliseconds. Subsequently, the output of the circuit 100 provides the desired delay pulse (i.e., a few milliseconds).

Also, in some limited cases, the level detector 102 may require a start-up signal. The start up signal can be provided by the output rstc1b of the delay 106, as shown in FIG. 1. That is, in some scenarios, the output rstc1b from the delay 106 can be used to activate to the level detector 102.

Figure 2:
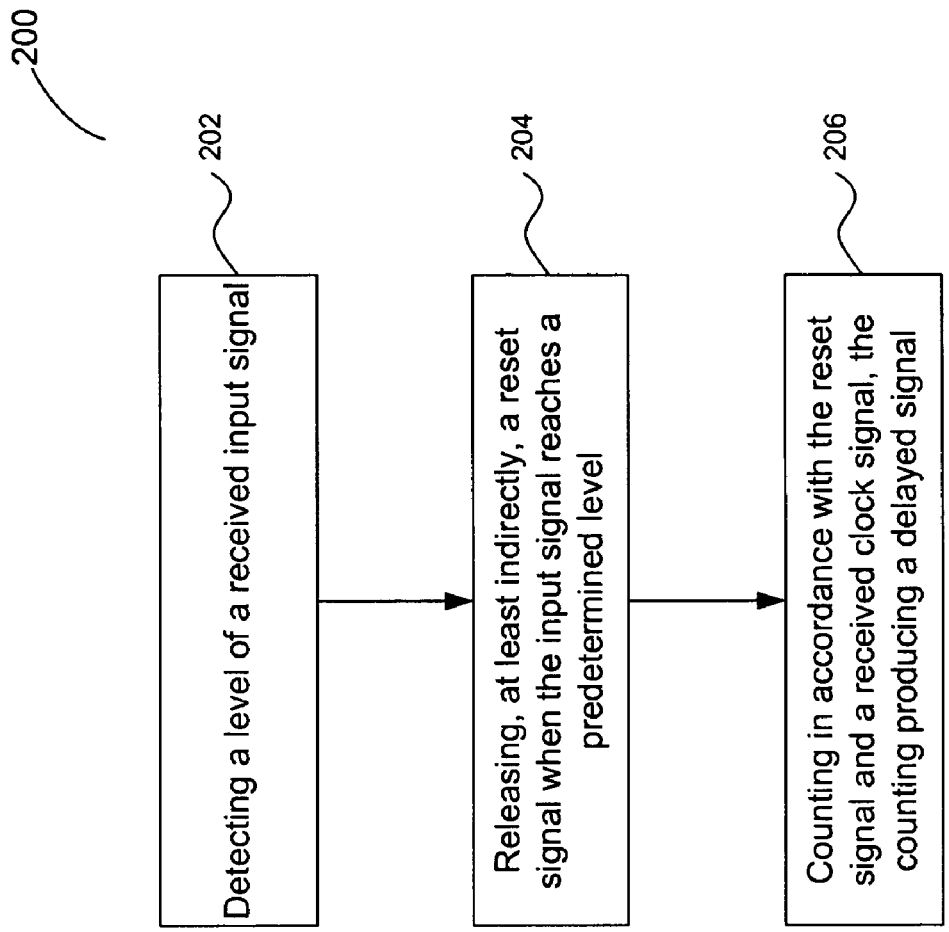
FIG. 2 is a flowchart of an exemplary method of practicing an embodiment of the present invention.

FIG. 2 is a flowchart 200 of an exemplary method of practicing the present invention. In FIG. 2, the level of a received input signal $V_{dd}$ is detected, as indicated in step 202. Next, a reset signal rstcb is produced, at least indirectly, when the input signal reaches a predetermined threshold level, as indicated in step 204. In step 206, counting occurs in accordance with the rest signal rstcb and a received clock signal CK. The counting produces a delayed signal rstb.

CONCLUSION

The present invention provides a power-on reset circuit that produces a delayed reset pulse as an output. The reset pulse can be used to reset any circuit requiring delayed activation. Additionally, the power-on reset circuit, of the present invention, can be formed on an IC for a more integrated approach to providing reset pulses.

The present invention has been described above with the aid of functional building blocks illustrating the performance of specified functions and relationships thereof. The boundaries of these functional building blocks have been arbitrarily defined herein for the convenience of the description. Alternate boundaries can be defined so long as the specified functions and relationships thereof are appropriately performed.

Any such alternate boundaries are thus within the scope and spirit of the claimed invention. Persons having ordinary skill in the art will recognize that these functional building blocks can be implemented by analog and/or digital circuits, discrete components, application-specific integrated circuits, firmware, processor executing appropriate software, and the like, or any combination thereof. Thus, the breadth and scope of the present invention should not be limited by any of the above-described exemplary embodiments, but should be defined only in accordance with the following claims and their equivalents.

The foregoing description of the specific embodiments will so fully reveal the general nature of the invention that others can, by applying knowledge within the skill of the art (including the contents of the references cited herein), readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein.

It is to be understood that the phraseology or terminology herein is for the purpose of description and not of limitation, such that the terminology or phraseology of the present specification is to be interpreted in light of the teachings and guidance presented herein, in combination with the knowledge of one of ordinary skill in the art.

What is claimed is:

1. An apparatus, comprising:
   a level detector configured to (i) receive an input signal and (ii) produce a threshold signal when the input signal reaches a predetermined level; and
   a delay circuit configured to receive the input signal and produce an output signal in accordance with a predetermined delay factor, the output signal being provided as an input to the level detector; and
   a counter having counting characteristics and configured to (i) receive an input reset signal and a clock signal and (ii) produce a delayed signal in accordance with the counting characteristics, the clock signal, and the received input reset signal;
   wherein the delayed signal forms an output reset pulse.

2. The apparatus of claims 1, wherein the apparatus is a power-on reset circuit.

3. The apparatus of claim 1, wherein the level detector and the counter are formed on a single integrated circuit (IC).

4. The apparatus of claim 3, further comprising a clock generator to produce the clock signal.

5. The apparatus of claim 4, wherein the clock generator is formed on the IC.

6. The apparatus of claim 3, wherein the delay circuit is formed on the IC.

7. The apparatus of claim 1, wherein the threshold signal is logically combined with the output signal to produce the input reset signal.

8. The apparatus of claim 4, wherein the delayed signal is provided as an input to the clock generator and the delay circuit.

9. A method for producing an output reset pulse, comprising:
   detecting a level of a received input signal;
   producing a threshold signal when the input signal reaches a predetermined level; and
   producing an output signal in accordance with a predetermined delay factor, the detecting being based upon the output signal; and
   counting in accordance with a reset signal and a received clock signal, the counting producing a delayed signal, the delayed signal forming the output reset pulse.

10. The method of claim 9, further comprising logically combining the threshold signal and the output signal to produce the input reset signal.

11. The method of claim 10, wherein the logically combining includes a logical NAND operation.

* * * * *